(12) United States Patent
Schmalz et al.

(10) Patent No.: US 7,035,067 B2
(45) Date of Patent: Apr. 25, 2006

(54) APPARATUS FOR DETECTING COIL FAILURE IN AN ACTUATING SOLENOID OF AN ELECTRICAL POWER SWITCH

(75) Inventors: Steven C. Schmalz, Greenfield, WI (US); Michael F. Walz, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 428 days.

(21) Appl. No.: 10/409,256

(22) Filed: Apr. 8, 2003

(65) Prior Publication Data

US 2004/0201944 A1 Oct. 14, 2004

(51) Int. Cl.
*H02H 9/08* (2006.01)

(52) U.S. Cl. .......................................... 361/42; 361/43

(58) Field of Classification Search ................... 361/42, 361/43, 44, 45, 46–50, 114, 115
See application file for complete search history.

(56) References Cited

U.S. PATENT DOCUMENTS

| | | | | |
|---|---|---|---|---|
| 4,479,117 A | * | 10/1984 | Marquardt | 340/644 |
| 4,764,884 A | * | 8/1988 | Noyori | 701/14 |
| 6,052,266 A | * | 4/2000 | Aromin | 361/49 |
| 6,590,753 B1 | * | 7/2003 | Finlay | 361/42 |
| 6,873,153 B1 | * | 3/2005 | Frydman | 324/307 |
| 2003/0058588 A1 | * | 3/2003 | Butcher et al. | 361/22 |

* cited by examiner

*Primary Examiner*—Brian Sircus
*Assistant Examiner*—Danny Nguyen
(74) *Attorney, Agent, or Firm*—Marvin L. Union

(57) ABSTRACT

The continuity of the coil of the actuating solenoid of an electric power switch is detected through utilization of a signaling device, such as a light emitting diode (LED) that monitors energization of a dc power supply fed from the source side of the coil. A circuit energized from the other side of the coil generates a dc voltage V2 that is applied to the gate electrode of an electronic switch shunting the LED. The voltage V2 is greater than the dc supply voltage to bias the electronic switch off so that the LED is illuminated when there is continuity through the coil. If the coil fails, V2 will be zero and the electronic switch is turned on to short circuit the LED to signal the failure of the coil.

8 Claims, 1 Drawing Sheet

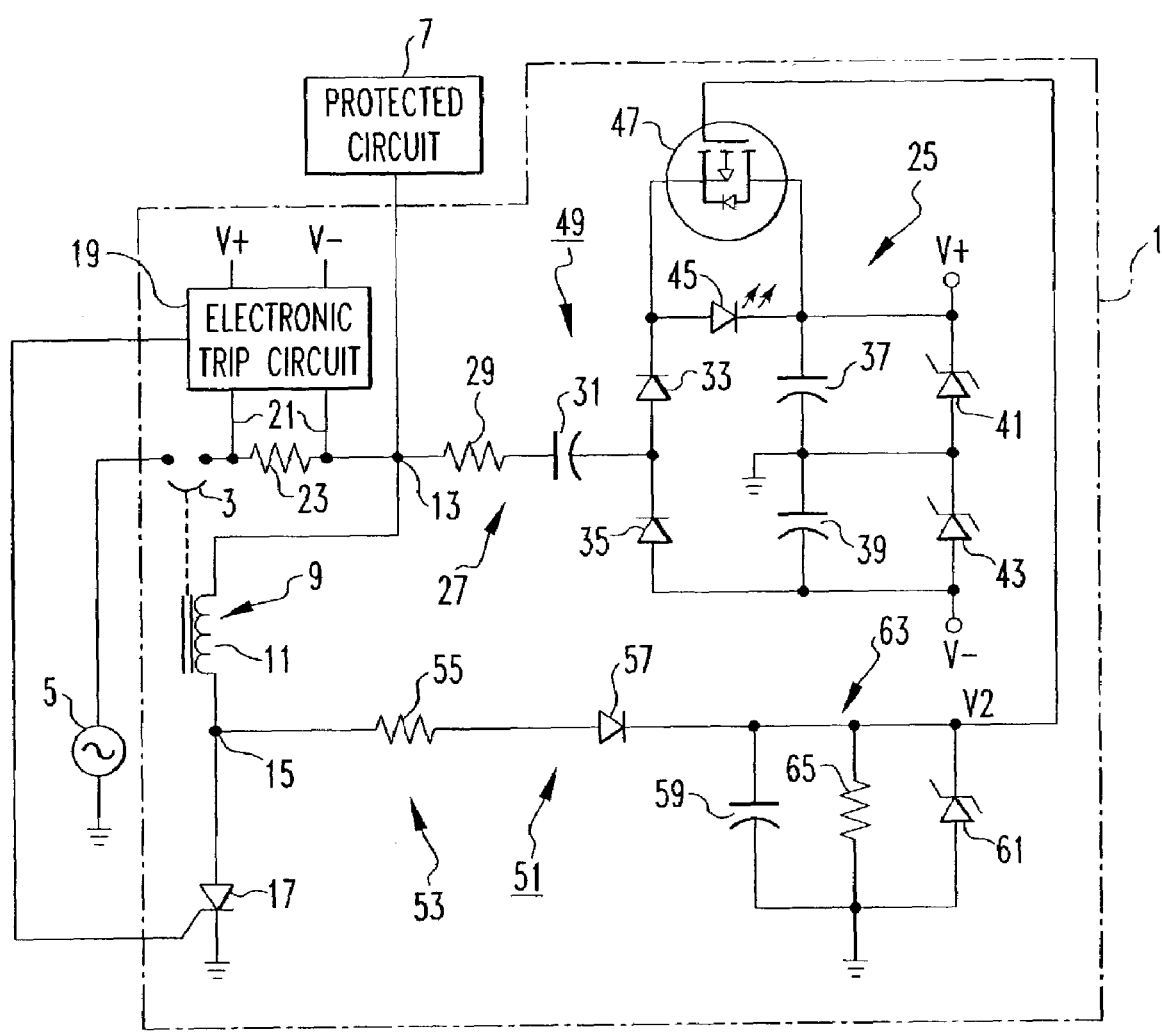

APPARATUS FOR DETECTING COIL FAILURE IN AN ACTUATING SOLENOID OF AN ELECTRICAL POWER SWITCH

BACKGROUND OF THE INVENTION

1. Field of the Invention

This invention relates to detection of coil failure in an actuating solenoid of an electric power switch, and particularly to loss of electrical continuity through the coil due to a break in the coil winding.

2. Background Information

Electric power switches having an electronic control circuit typically have an actuating solenoid that is energized to actuate the switch when the electronic circuit detects a fault condition. For instance, when the electronic trip circuit of an arc fault circuit breaker detects arcing in the protected circuit, a trip signal energizes the actuating solenoid to interrupt power flow in the protected circuit. Unfortunately, the coil of the actuating solenoid may be damaged as a result of overheating or mechanical impact. Such damage may include a break in the coil winding, thereby rendering the solenoid nonfunctional. A failure of this type compromises the ability of the electric power switch such as the arc fault interrupter to perform its primary function.

There is a need, therefore, for apparatus which can provide an indication of failure of an actuating solenoid so that corrective action can be taken.

SUMMARY OF THE INVENTION

This need, and others, are satisfied by the invention which is directed to apparatus for detecting coil failure in an actuating solenoid of an electric power switch where the solenoid is energized by a power source connected to a first solenoid coil terminal through a power switch connected in series with the power source and a second terminal of the actuating solenoid. The apparatus comprises a first circuit connected to the first terminal of the actuating solenoid coil and including a signaling device and a shunt switch shunting the signaling device. The signaling device is energized when the shunt switch is off and is shorted when the shunt switch is turned on. The apparatus further includes a second circuit connected to the second terminal of the actuating solenoid coil to turn the shunt switch off when there is electrical continuity through the solenoid and to turn the shunt switch on with electrical continuity through the actuating solenoid coil lost.

More particularly, the shunt switch can be an electronic switch and the first circuit comprises a voltage dropping circuit that drops voltage from the power source at the first terminal of the actuating solenoid coil to a first voltage applied to the electronic switch. The second circuit comprises a second voltage dropping circuit that drops voltage at the second terminal of the actuating solenoid coil to a second voltage that biases the electronic switch. The second voltage is greater than the first voltage to bias the electronic switch off when there is electrical continuity through the actuating solenoid. Thus, the signaling device is actuated to indicate the health of the actuating solenoid coil. However, the second voltage drops to zero and, therefore, becomes insufficient to bias the electrical switch off upon loss of continuity through the actuating solenoid, and the signaling device is not actuated indicating failure of the actuating solenoid coil.

Where the power source is an ac source, the first circuit further includes a dc power supply energized through the first voltage dropping circuit and the signaling device is powered by the de power supply and when energized indicates the operability of the de power supply as well as continuity through the actuating solenoid coil.

In the preferred embodiments of the invention, the signaling device is a light emitting diode and the electronic switch is a MOSFET.

BRIEF DESCRIPTION OF THE DRAWINGS

A full understanding of the invention can be gained from the following description of the preferred embodiments when read in conjunction with the accompanying drawing in which:

The figure is a schematic circuit diagram of an arc fault circuit breaker incorporating the invention.

DESCRIPTION OF THE PREFERRED EMBODIMENTS

The invention is directed to apparatus for detecting loss of electrical continuity in the actuating coil of an electric power switch. The invention will be described as applied to an arc fault circuit breaker, but it will be apparent that it has application to other types of electric power switches incorporating an actuating solenoid. The arc fault circuit breaker 1 can be of various known types. This arc fault circuit breaker 1 includes a set of separable contacts 3 that are inserted in series between an ac power source 5 and a protected circuit 7. The separable contacts 3 can be operated by an actuating solenoid 9 that includes a winding or coil 11. The solenoid coil 11 has a first terminal 13 that is on the load side of the separable contacts 3 and a second terminal 15 that is connected to a power switch 17 such as a silicon control rectifier (SCR). The separable contacts 3, solenoid 9 and power switch 17 form a series circuit with the ac power source 5. When the switch 17 is turned on, energization of the actuating solenoid 9 results in opening of the separable contacts 3.

The power switch 17 is turned on by a trip signal generated by the electronic trip circuit 19. Electronic trip circuits are well known and provide various types of protection. For instance, electronic circuits can provide overcurrent and overload protection. Other electronic circuits provide ground fault protection. The exemplary electronic trip circuit 19 provides arc fault protection. The various types of protection can be combined in the electronic trip circuit 19.

The electronic (arc fault) trip circuit 19 in the exemplary circuit breaker 1 monitors the current in the protected circuit 7 through a shunt connection 21 across a resistance 23. This resistance can be in the form of a discrete resistor or just the known resistance in a section of conductor. Alternatively, the resistance 23 can be the resistance of a bimetal in a conventional thermal-magnetic trip device (not shown) which provides the overcurrent and overload protection for the arc fault circuit breaker 1 as shown, for instance, in U.S. Pat. No. 5,519,561. The electronic (arc fault) trip circuit 19 analyzes the current in the protected circuit and upon detecting an arcing condition generates a trip signal which turns on the power switch 17. There are numerous known arc fault trip circuits. A suitable example is described in U.S. Pat. No. 6,522,509.

The arc fault circuit breaker 1 further includes a first dc power supply 25 for generating V+ and V− dc voltages for the arc fault trip circuit 19. This dc power supply 25 is energized from the power source 5 through a first voltage dropping circuit 27 formed by the resistor 29 and capacitor 31 connected in series at the first terminal 13 of the actuating solenoid coil 11. The first dc power supply 25 is a zener diode regulated dual-voltage power supply formed by the diodes 33 and 35 that conduct alternately to rectify the positive and negative half cycles, respectively, of the ac voltage from the first voltage dropping circuit 27 to provide charging pulses to capacitors 37 and 39 to generate a V+ voltage and a V− voltage. These capacitors 37 and 39 filter noise and minimize voltage variation between charge cycles. A zener diode 41 regulates the positive dc voltage V+ across the capacitor 37 while zener diode 43 similarly regulates the negative dc voltage V− across the capacitor 39.

A signaling device in the form of light emitting diode (LED) 45 connected between the diode 33 and capacitor 37 is energized by the charge pulses flowing into the capacitor 37 of the first dc power supply 25, and therefore, provides an indication of the operability of the first dc power supply.

The arc fault circuit breaker 1 as described to this point is known. The additional circuitry to be described provides the capability of detecting failure of the coil 11 in the actuating solenoid 9. The additional apparatus includes an electronic switch 47 shunting the LED 45. In the exemplary circuit, the electronic switch 47 is a MOSFET. The MOSFET 47, the LED 45, the first dc power supply 25 and the first voltage dropping circuit 27 together comprise a first circuit 49 connected to the first terminal 13 of the actuating solenoid coil 11. A second circuit 51 is connected to the second terminal 15 of the actuating solenoid coil 11. This second circuit includes a second voltage dropping circuit 53 formed by the resistor 55. Diode 57, capacitor 59, and zener diode 61 form a second zener diode regulated dc power supply 63 that produces a voltage V2 that is higher than the first positive supply voltage V+. A resistor 65 provides a discharge path for the capacitor 59.

The voltage V2 is applied as a bias voltage to the gate electrode of the MOSFET 47. In normal operation, with an undamaged actuating solenoid coil 11, the second voltage V2 biases the MOSFET 47 at a sufficient voltage such that the transistor does not conduct, and therefore supply current flows through and illuminates LED 45. If the solenoid coil winding integrity is compromised due to damage resulting in a loss of electrical continuity of the coil, the second dc power supply 63 fails to generate a voltage V2 since there is no voltage at the second terminal 15 of the actuating solenoid coil 11. A voltage greater than the V+ supply is therefore not established on the gate of the MOSFET 47 to inhibit the transistor from conducting. With the MOSFET 47 conducting, supply current is bypassed around the LED 45 to keep it from illuminating. The failure of the LED 45 to light up indicates to the operator that there is a problem with the operational health of the circuit breaker. The cause could be either a failure of the coil 11 of the actuating solenoid 9 or a failure of the first dc supply 25.

The invention provides an especially efficient arrangement for determining the health of the actuating solenoid coil 11 by cooperating with existing circuitry such as the dc power supply 25 for the electronic trip circuit 19 and the signaling device 45 indicating energization of that dc power supply.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An apparatus for detecting failure of an actuating solenoid coil of an electric power switch where the actuating solenoid coil is energized by a power source connected to a first terminal of the actuating solenoid coil through a power switch connected in series with the power source and a second terminal of the actuating solenoid coil, the apparatus comprising:
   a first circuit connected to the first terminal of the actuating solenoid coil and comprising a signaling device and a shunt switch shunting the signaling device, the signaling device being energized with the shunt switch turned off and being shorted with the shunt switch turned on; and
   a second circuit connected to the second terminal of the actuating solenoid coil, the second circuit being energized through the actuating solenoid coil to turn the shunt switch off with continuity through the actuating solenoid coil, and being deenergized to turn the shunt switch on with loss of continuity through the actuating solenoid coil.

2. An apparatus for detecting failure of an actuating solenoid coil of an electric power switch where the actuating solenoid coil is energized by a power source connected to a first terminal of the actuating solenoid coil through a power switch connected in series with the power source and a second terminal of the actuating solenoid coil, the apparatus comprising:
   a first circuit connected to the first terminal of the actuating solenoid coil and comprising a signaling device and a shunt switch shunting the signaling device, the signaling device being energized with the shunt switch turned off and being shorted with the shunt switch turned on; and
   a second circuit connected to the second terminal of the actuating solenoid coil, the second circuit being energized through the actuating solenoid coil to turn the shunt switch off with continuity through the actuating solenoid coil, and being deenergized to turn the shunt switch on with loss of continuity through the actuating solenoid coil,
   wherein the first circuit comprises a first voltage dropping circuit that drops voltage from the power source at the first terminal of the actuating solenoid coil to a first voltage applied to the shunt switch and the second circuit comprises a second voltage dropping circuit that drops a voltage at the second terminal of the actuating solenoid coil to a second voltage that is higher than the first voltage with continuity through the actuating solenoid coil and that is below the first voltage with continuity through the actuating solenoid coil lost, the shunt switch comprising an electronic switch energized by the first voltage and biased by the second voltage so that the electronic switch is turned off when there is continuity through the actuating solenoid coil and the second voltage is above the first voltage, and is turned on to short the signaling device when continuity through the actuating solenoid coil is lost and the second voltage drops below the first voltage.

3. The apparatus of claim 2, wherein the power source is an ac power source and the first circuit includes a first dc power supply energized through the first voltage dropping circuit, the signaling device being powered by, and when energized, indicating energization of the first dc power supply.

4. The apparatus of claim 3, wherein the signaling device is a light emitting diode.

5. The apparatus of claim 3, wherein the first voltage dropping circuit comprises a resistor and a capacitor connected in series between the first terminal of the actuating solenoid coil and the first dc power supply.

6. The apparatus of claim 3, wherein the second circuit includes a second dc power supply generating the second voltage as a dc bias voltage applied to the electronic switch.

7. The apparatus of claim 6, wherein the signaling device is a light emitting diode and the electronic switch is a MOSFET.

8. The apparatus of claim 1, wherein the signaling device is a light emitting diode.

* * * * *